(12) United States Patent
Weber et al.

(10) Patent No.: US 8,913,394 B2
(45) Date of Patent: *Dec. 16, 2014

(54) ELECTRICAL COMPONENTS COUPLED TO CIRCUIT BOARDS

(75) Inventors: Douglas Joseph Weber, Arcadia, CA (US); Pinida Jan Moolsintong, San Francisco, CA (US); Robert Sean Murphy, Sunnyvale, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 13/409,623

(22) Filed: Mar. 1, 2012

(65) Prior Publication Data

US 2012/0170236 A1  Jul. 5, 2012

Related U.S. Application Data

(60) Continuation of application No. 12/634,114, filed on Dec. 9, 2009, now Pat. No. 8,144,475, which is a division of application No. 11/519,388, filed on Sep. 11, 2006, now Pat. No. 7,660,127.

(51) Int. Cl.
| | |
|---|---|
| *H05K 7/00* | (2006.01) |
| *H05K 1/14* | (2006.01) |
| *G06F 1/18* | (2006.01) |
| *H05K 1/18* | (2006.01) |

(52) U.S. Cl.
CPC ...... *H05K 1/147* (2013.01); *H05K 2201/10189* (2013.01); *H05K 1/189* (2013.01); *G06F 1/186* (2013.01)
USPC ............. 361/728; 361/805; 361/752; 439/65; 439/67

(58) Field of Classification Search
USPC ......... 361/600, 752, 728–730, 797, 800, 805; 174/68.1, 250, 261; 439/55, 59, 61, 65, 439/67, 70–71, 86, 91

See application file for complete search history.

(56) References Cited

U.S. PATENT DOCUMENTS

| | | |
|---|---|---|
| 5,186,646 A | 2/1993 | Pederson |
| 5,411,416 A | 5/1995 | Balon et al. |
| 5,485,672 A | 1/1996 | Carpenter et al. |
| 5,541,448 A | 7/1996 | Carpenter |
| 5,838,412 A | 11/1998 | Ueda et al. |
| 6,558,201 B1 | 5/2003 | Begley et al. |
| 6,721,176 B2 | 4/2004 | Kwong et al. |
| 7,004,780 B1 | 2/2006 | Wang |
| 7,004,794 B2 | 2/2006 | Wang et al. |
| 7,108,560 B1 | 9/2006 | Chou et al. |
| 7,214,888 B1 * | 5/2007 | Feroli et al. .................... 174/365 |
| 7,515,431 B1 | 4/2009 | Zadesky et al. |
| 7,517,231 B2 * | 4/2009 | Hiew et al. ................... 439/76.1 |
| 7,573,724 B2 | 8/2009 | Hur |
| 7,586,751 B2 | 9/2009 | Ho et al. |
| 2007/0254212 A1 | 11/2007 | Viavattine |

* cited by examiner

*Primary Examiner* — Hung S Bui
(74) *Attorney, Agent, or Firm* — Michael H. Lyons (57) ABSTRACT

The present invention can facilitate the coupling between electrical components and a circuit board after the circuit board is inserted into a housing of an electronic device. An electrical component can be integrated with a flexible circuit of another electrical component. The flexible circuit can be electrically and mechanically coupled to the circuit board after the circuit board is inserted into the housing. Alternatively, electrical contacts can be disposed on a body of the electrical component and a complementary set of electrical contacts can be disposed on the circuit board. When the circuit board is disposed within a receptacle of the electrical component, the electrical contacts on the electrical component are coupled directly to the electrical contacts on the circuit board.

36 Claims, 13 Drawing Sheets

ELECTRICAL COMPONENTS COUPLED TO CIRCUIT BOARDS

CROSS-REFERENCE TO RELATED APPLICATION

This application is continuation of U.S. patent application Ser. No. 12/634,114 filed Dec. 9, 2009, which is a divisional of U.S. patent application Ser. No. 11/519,388 filed Sep. 11, 2006 (now U.S. Pat. No. 7,660,127), each of which is hereby incorporated by reference herein in its entirety.

FIELD OF THE INVENTION

The present invention can relate to methods and apparatus for coupling electrical components to a circuit board.

BACKGROUND OF THE INVENTION

An electronic device may include a housing with one or more openings through which electrical components of the device are assembled into the housing. The electrical components can be electrically coupled to a circuit board so that it may communicate data to and from other electrical components that may be electrically coupled to the circuit board.

In some electronic devices, electrical components may be mechanically and electrically coupled to the circuit board before the assembly is disposed into the housing. The electrical components may be coupled to the circuit board by discrete wires soldered to the components. However, as electronic devices become smaller and thinner, such electronic devices may be challenging to manufacture.

For example, an electronic device housing may be designed so that it may be more desirable or practical for some electrical components to be mechanically and electrically coupled to the circuit board after the circuit board is disposed within a housing of the device. This may occur when the size or design of the housing or obstructions within the housing prevents one of the electrical components from being preassembled to the circuit board before the circuit board is inserted into the housing.

Furthermore, when discrete wires are used to couple components to a circuit board, the electronic device may be difficult to manufacture because each discrete wire may need to be hand-soldered to the electrical components. Once the wires are soldered to the components, it may be difficult to neatly insert the wires into the housing. Indeed, the wires may occupy precious space within the housing when space is at a premium.

There also may be reliability concerns. For example, solder joints may be compromised when the circuit board and the electrical component are inserted into the housing. The solder joints also may be compromised as a result of damage from regular use of the electronic device or from external forces applied to the electronic device.

SUMMARY OF THE INVENTION

The present invention can permit electrical components to be coupled electrically to a circuit board after the circuit board is disposed in a housing.

In one embodiment, the present invention can accomplish this by electrically integrating an electrical component to a flexible circuit of another electrical component. The integrated flexible circuit then may be coupled both electrically and mechanically to the circuit board after the circuit board is inserted into the housing. The integrated flexible circuit can be coupled to the circuit board using a board-to-board connector. Advantageously, the flexible circuit can fit neatly into the housing, and may act as a mechanical stop to reinforce the board-to-board connection.

In another embodiment of the present invention, electrical contacts can be disposed on a body of the electrical component and a complementary set of electrical contacts can be disposed on the circuit board. When the circuit board is disposed within a receptacle of the electrical component, the electrical contacts on the electrical component can be coupled directly to the electrical contacts on the circuit board.

Advantageously, electronic devices employing the present invention may be more reliable and facilitate assembly because discrete wires need not be hand-soldered to the electrical component.

DETAILED DESCRIPTION OF THE DRAWINGS

Figure 1:
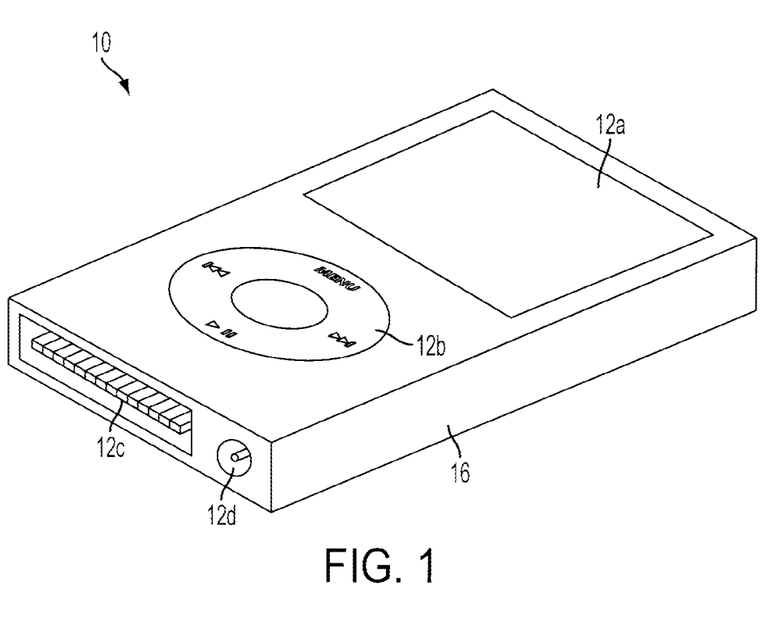
FIG. 1 illustrates an exemplary electronic device that can incorporate the present invention.
Figure 2A:
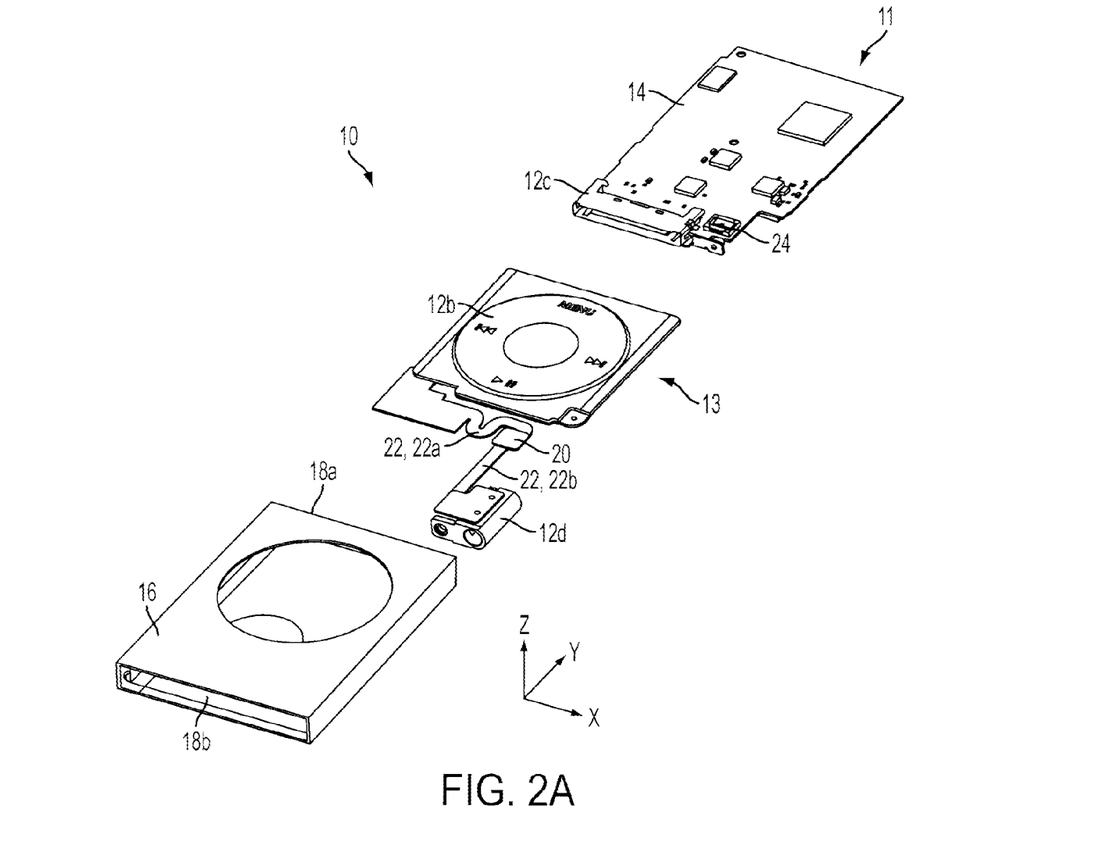
FIG. 2A illustrates an exploded view of a first embodiment in accordance with the present invention.
Figure 2B:
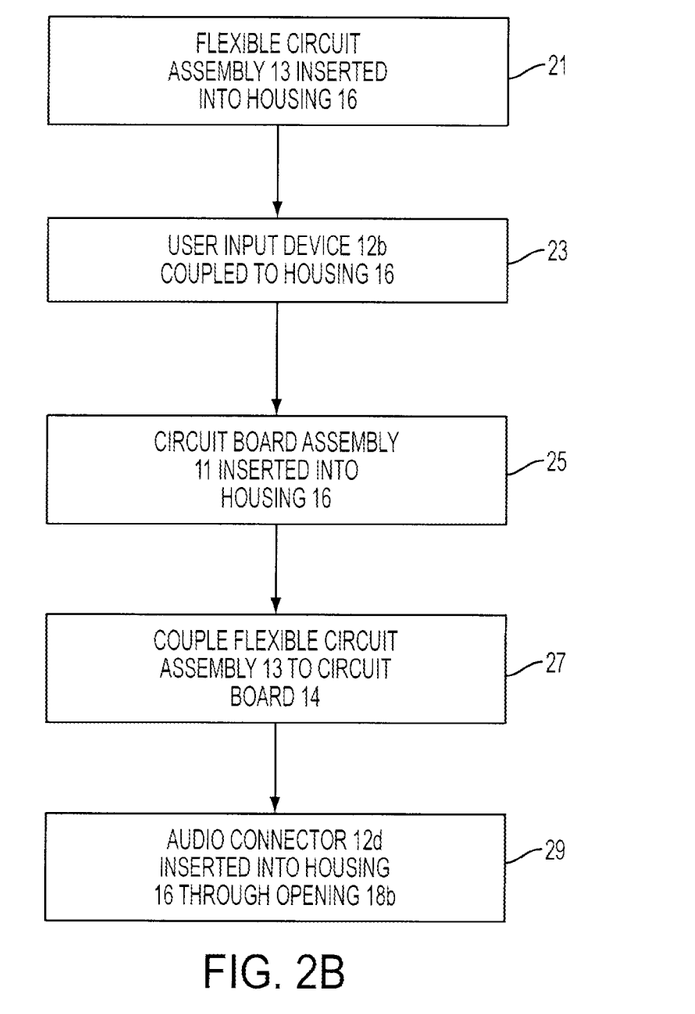
FIG. 2B provides an exemplary flowchart of steps for assembling the electronic device of FIG. 2A in accordance with the present invention.

FIGS. 1-2 illustrate an exemplary electronic device that can incorporate the present invention. Electronic device 10 can be any electronic device that has electrical components coupled to a circuit board, including portable, mobile, hand-held, or miniature consumer electronic devices. Illustrative electronic devices can include, but are not limited to, music players, video players, still image players, game players, other media players, music recorders, video recorders, cameras, other media recorders, radios, medical equipment, calculators, cellular phones, other wireless communication devices, personal digital assistances, programmable remote controls, pagers, laptop computers, printers, or combinations thereof. Miniature electronic devices may have a form factor that is smaller than that of hand-held devices. Illustrative miniature electronic devices can include, but are not limited to, watches, rings, necklaces, belts, accessories for belts, headsets, accessories for shoes, virtual reality devices, other wearable electronics, accessories for sporting equipment, accessories for fitness equipment, key chains, or combinations thereof.

Electronic device 10 can have multiple input/output (I/O) components 12a-d disposed within housing 16. The I/O components can include any type of component that receives and/or transmits digital and/or analog data, e.g., audio data, video data, other types of data, or a combination thereof. For example, I/O component 12a may be a display that provides graphic images to a user, I/O component 12b may be a user input component that can permit a user to input data into the electronic device, I/O component 12c may be a multiple-pin connector that can permit electronic device 10 to interact with a computer, and I/O component 12d may be a media output connector that can output media data to an accessory. Accessories can include docks, printers, external storage devices, external displays, speakers, lanyards having headphones coupled thereto, and other audio and/or visual output devices.

In one embodiment of the present invention, user input component 12b may be a trackwheel similar to that used by the iPod™ device sold by Apple Computer, Inc. of Cupertino, Calif. The trackwheel can include one or more buttons for selecting software entries and a capacitive touchpad. The touchpad may permit a user to scroll through software menus by running the user's finger in circles around the track of the trackwheel. In alternative embodiments, user input component 12b may include, for example, one or more buttons, a touchpad, a touchscreen display, electronics for accepting voice commands, antennas, infrared ports, or combinations thereof.

In one embodiment of the present invention, multiple-pin connector 12c may have 30 pins that transmit data to and from the electronic device. Multiple-pin connector 12c may be similar to that described in U.S. Pat. No. 6,776,660 to Kubota et al., which is incorporated herein by reference in its entirety. Multiple-pin connector 36 also may have an interface system similar to that described in U.S. Pat. No. 7,441,062 to Novotney et al., which is incorporated herein by reference in its entirety. In alternative embodiments, multiple-pin connector 12c may have any configuration known in the art or otherwise.

In one embodiment of the present invention, media output connector 12d can include an audio connector that transmits audio data to speakers or headphones. In alternative embodiments, media output connector 12d can output, for example, video data, still image data, games data, or other media data known in the art or otherwise. Media output connector also can output combinations of media data.

Housing 16 of electronic device 10 may be designed to have a closed back and openings 18a,b disposed at different sides (e.g., opposing ends) of housing 16. Components of the device may be inserted into housing 16 through one or more openings 18a,b. Manufacturing and/or design constraints may deem it more desirable or practical that audio connector 12d be coupled electrically to circuit board 14 after the circuit board is inserted into housing 16 via opening 18a. That is, it may be more desirable for circuit board 14 to be inserted into housing 16 separately from audio connector 12d. Once circuit board 14 is enclosed within housing 16, it may become difficult to access the circuit board to electrically couple audio component 12d to the circuit board.

The present invention can permit the audio connector, or other electrical components, to be coupled electrically to the circuit board after the circuit board is inserted into the housing. The present invention can accomplish this by electrically integrating the audio connector to a flexible circuit of another electrical component. The integrated flexible circuit then may be coupled both electrically and mechanically to the circuit board after the circuit board is inserted into the housing. Alternatively, the audio connector can have a receptacle and the circuit board may slide directly therein. Electrical contacts disposed on the audio connector and the circuit board can establish direct electrical contact between the two components when the circuit board is disposed within the receptacle of the audio connector.

Figure 3:
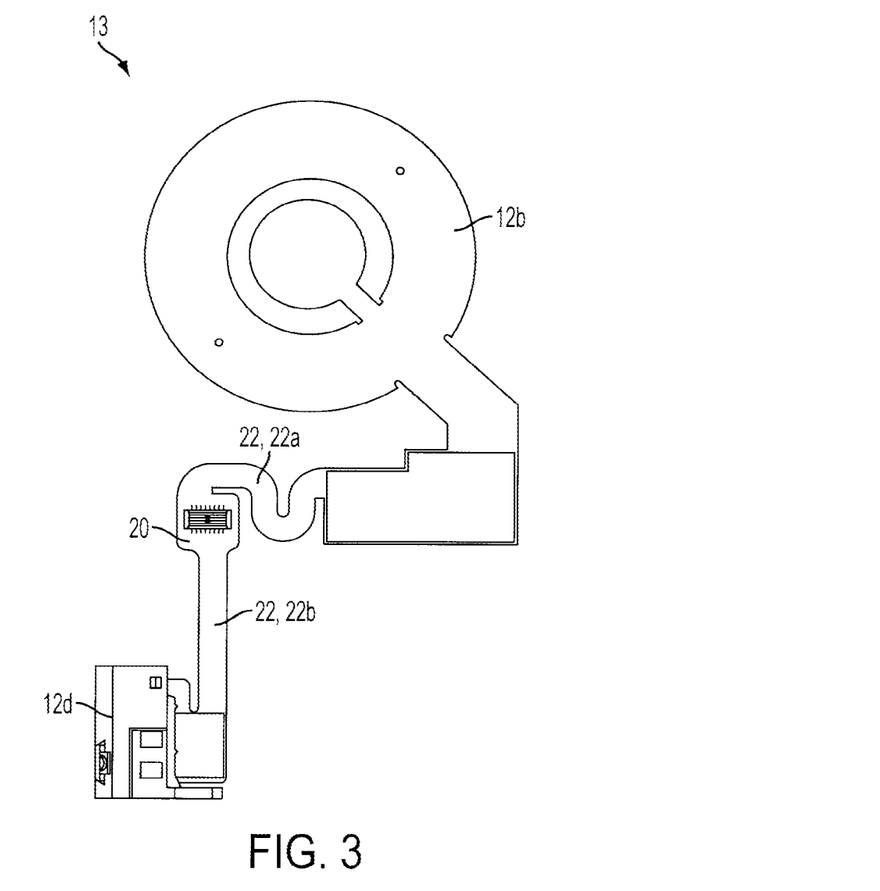
FIG. 3 illustrates an enlarged view of input/output (I/O) components and a flexible circuit in accordance with the present invention.

FIGS. 2A and 3 show a first embodiment of the present invention. Electronic device 10 can include, among other things, circuit board assembly 11 and flexible circuit assembly 13.

Circuit board assembly 11 can include circuit board 14 coupled to multiple-pin connector 12c. Circuit board assembly 11 also can include other components that are not shown in FIG. 2A for simplicity of illustration, e.g., display 12a of FIG. 1 and a battery.

Flexible circuit assembly 13 can include user input component 12b, audio component 12d, integrated flexible circuit 22, and board-to-board connector 20. Flexible circuit 22 can include user input component portion 22a and audio connector portion 22b to which user input component 12b and audio connector 12d can be coupled respectively. User input component portion 22a and audio connector portion 22b can electrically and mechanically couple user input component 12b and audio connector 12d to board-to-board connector 20. Board-to-board connector 20 may be designed to mate with complementary board-to-board connector 24 disposed on circuit board 14, thereby coupling assembly 13 to circuit board 14. Board-to-board connectors 20 and 24 may have connectors that can transmit data to and receive data from each other when the electrical contacts are in contact. By integrating audio connector 12d to user input component 12b, board-to-board connectors 20 and 24 may incorporate more contacts than board-to-board connectors coupled to one electrical component only.

In one embodiment, user input component 12b and audio connector 12d can be coupled to flexible circuit 22 using surface mount technology (SMT), which may be more reliable than hand-soldered joints. In alternative embodiments, the user input component and the audio connector may be electrically coupled to the flexible circuit using other methods known in the art or otherwise.

Flexible circuit 22 can include any flexible printed circuit (FPC), including one-sided, double-sided, multi-layer FPCs, or combinations thereof. In alternative embodiments, flexible circuit 22 can be replaced with ribbon cables, other types of cables, wires, other types of data transmission lines, or combinations thereof.

FIG. 2B provides a flowchart of steps for assembling electronic device 10 in accordance with one embodiment of the present invention. In step 21, flexible circuit assembly 13 can be inserted into housing 16 through opening 18b. In step 23, user input component 12b then may be aligned with and coupled to opening 26 in housing 16 so that the user input component can be accessed externally by a user. This may dispose the user input component between the housing and the circuit board either directly or indirectly through other components of the electronic device.

Figure 4:
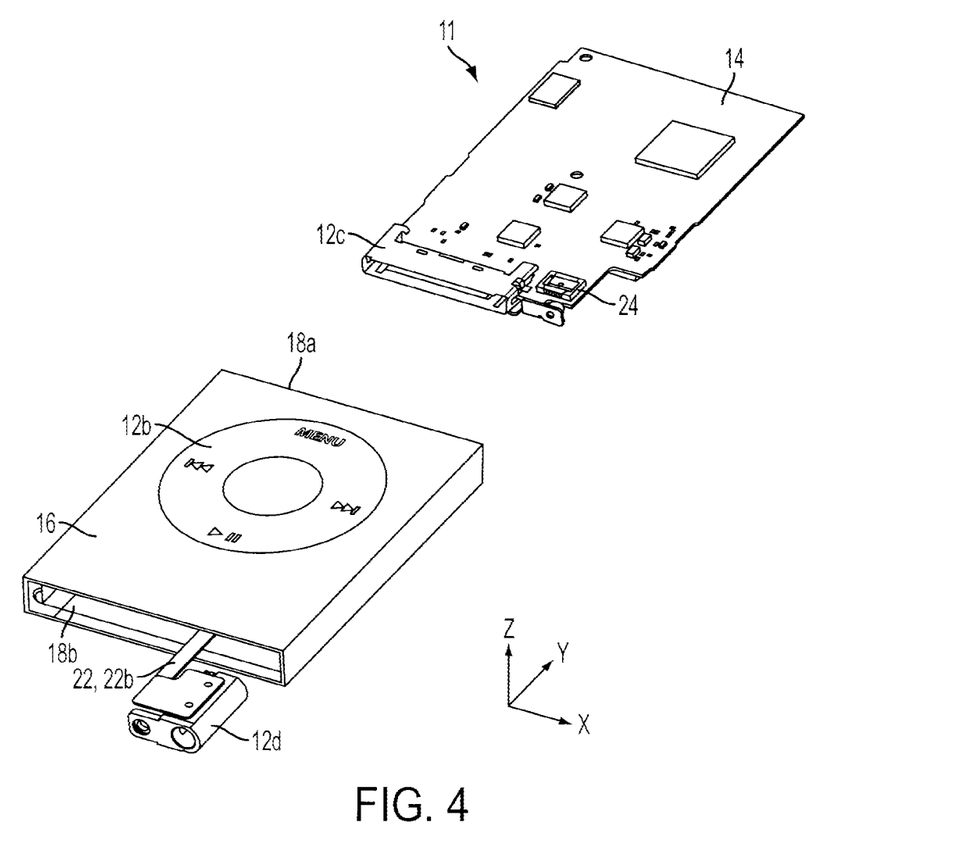
FIG. 4 illustrates assembly of the I/O components and the flexible circuit of FIGS. 2A and 3 within a housing of FIG. 2A in accordance with the present invention.

FIG. 4 illustrates flexible circuit 13 coupled to housing 16 of electronic device 10 in accordance with one embodiment of the present invention. Audio component portion 22b of flexible circuit 22 may have a length that disposes audio component 12d outside of housing 16 when user input component 12b is coupled to opening 26. Advantageously, this can keep audio component 12d from interfering with assembly of other components of electronic device 10, e.g., circuit board assembly 11, into housing 16.

Once flexible circuit assembly 13 is disposed within housing 16, circuit board assembly 11 may be inserted into housing 16 through opening 18a in accordance with step 25. Because audio component 12d is disposed outside of housing 16, circuit board assembly 11 can be inserted into housing 16 without interference or obstruction. However, if audio component 12d had been soldered onto circuit board 14 before inserting the circuit board assembly into housing 16, it may have been difficult or impossible to insert the assembly fully into the housing, for example, due to obstructions. Such obstructions may include components already disposed within the housing (e.g., user input component 12b), protrusions or narrowing inside the housing, a small cross-sectional area of opening 18a, a small z-height in the interior of the housing, or combinations thereof. As used herein, the z-height of a component may be the thickness of the component in the z-direction as indicated in FIG. 4.

The obstructions may make it impossible or impractical from a manufacturing standpoint to pre-assemble audio connector 12d to the circuit board before the circuit board is inserted into the housing. For example, user input component 12b may be disposed within housing 16 before circuit board assembly 11 is inserted into the housing. If the z-height of user input component 12b reduces the effective z-height of portions of the housing interior to a value that is less than the z-height of audio connector 12d and less than the z-height of portions of circuit board assembly 11, it may be more desirable and practical to insert circuit board assembly 11 and audio connector 12d from different openings 18a,b and thereafter couple the two together. Furthermore, if the z-height of the audio component is only slightly less than that of the housing interior, it may not be practical from a manufacturing standpoint to attempt to slide the audio connector through the interior length of the housing.

Accordingly, manufacturing and/or design constraints may deem it more desirable for circuit board assembly 11 to be inserted into housing 16 via first opening 18a and audio connector 12d to be inserted into housing 16 via second opening 18b. Thereafter, audio connector 12d can be electrically and mechanically coupled to circuit board 14 either directly or indirectly.

A cross-sectional area of circuit board assembly 11 may be equal to or less than that of opening 18a in order for the circuit board assembly to be inserted therethrough. Accordingly, the cross-sectional area of the opening through which the circuit board assembly is inserted may be large enough also to accommodate additional electrical components that may be preassembled to the circuit board, e.g., a display or battery.

Figure 5:
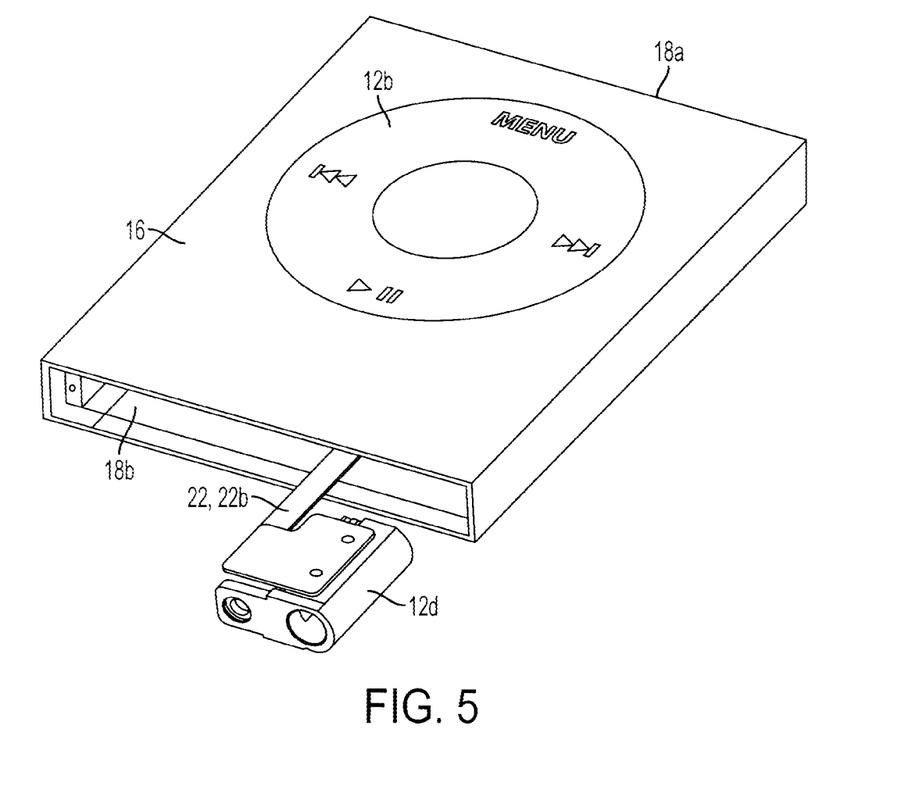
FIG. 5 illustrates assembly of the I/O components, the flexible circuit, and a circuit board of FIGS. 2A and 3 within the housing of FIG. 2A in accordance with the present invention.

FIG. 5 illustrates flexible circuit assembly 13 and circuit board assembly 11 inserted into housing 16 of electronic device 10 in accordance with the present invention.

Once circuit board assembly 11 is disposed within housing 16, user input component 12b and audio connector 12d can be coupled to circuit board 14 in accordance with step 27. Board-to-board connector 20 of flexible circuit 22 can mate with board-to-board connector 24 of circuit board 14, thereby electrically and mechanically coupling flexible circuit assembly 13 to the circuit board. Thereafter, audio connector portion 22b of flexible circuit 22 can be folded over itself. In step 29, audio connector 12d and audio connector portion 22b can be inserted into housing 16 through opening 18b. One skilled in the art can appreciate that a cross-sectional area of audio connector 12d may be equal to or less than that of opening 18b in order for the audio connector to be inserted therethrough.

To provide structural stability to audio connector 12d within housing 16, audio connector 12d can be mechanically coupled to electronic device 10 in accordance with U.S. Pat. No. 7,751,198 to Weber et al., which is incorporated herein by reference in its entirety.

Figure 6A:
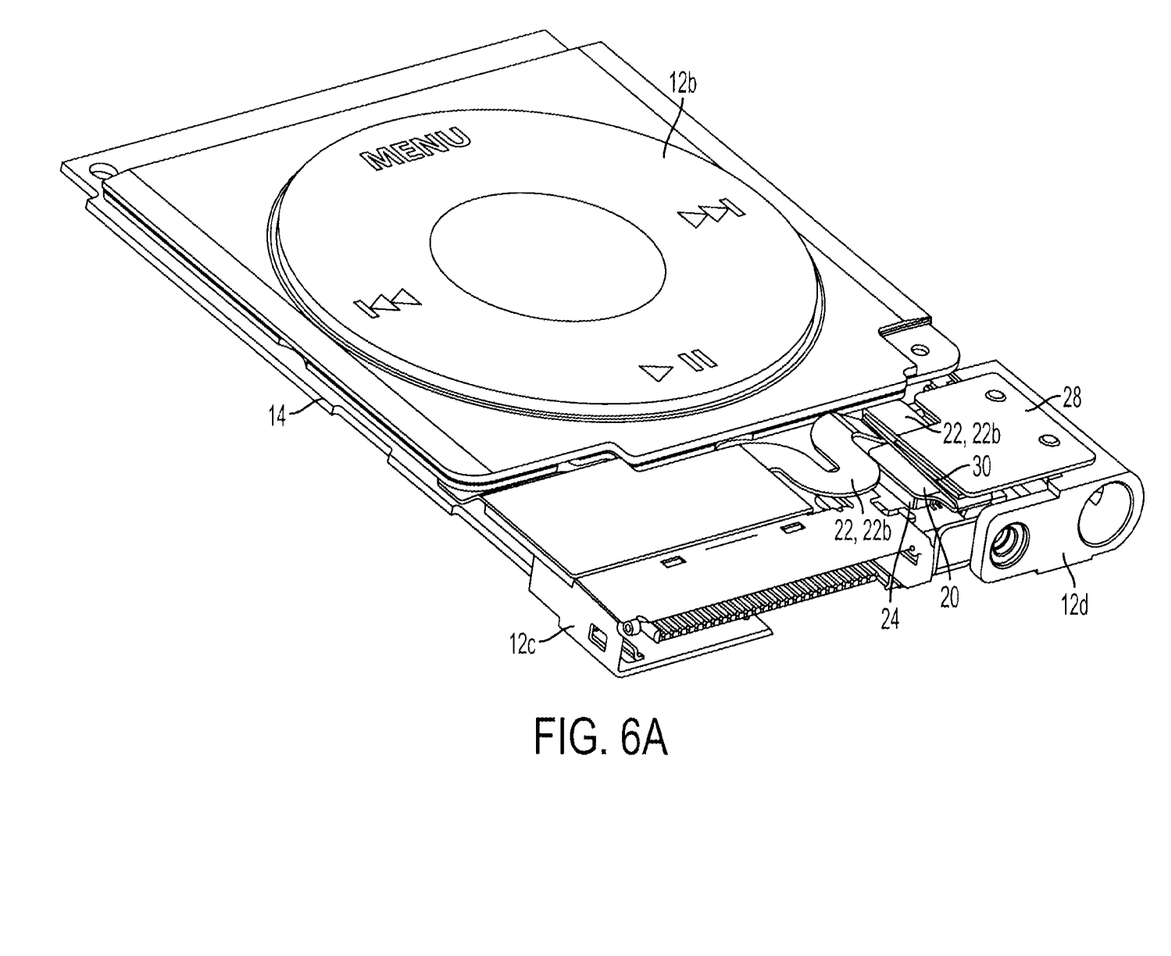
FIGS. 6A-B illustrate an assembly of the I/O components, the flexible circuit, and the circuit board of FIG. 2A, with the flexible circuit coupled to the circuit board in accordance with the present invention.
Figure 6B:
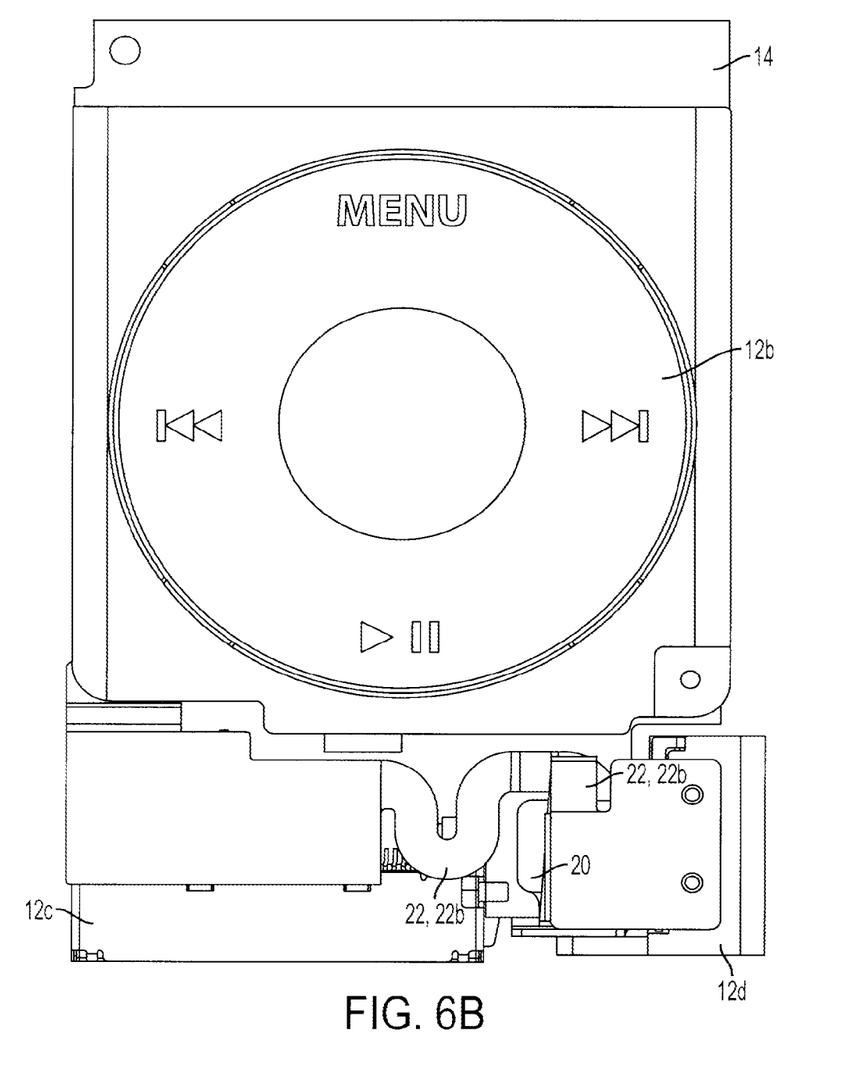

FIGS. 6A-6B illustrate audio connector portion 22b of flexible circuit 22 in its folded configuration. While housing 16 has been removed from FIGS. 6A-6B for clarity of illustration, audio connector portion 22b of flexible circuit 22 may be disposed between housing 16 and board-to-board connector 20 either directly or through other components of electronic device 10.

Audio connector portion 22b of flexible circuit 22 can act as a mechanical stop for board-to-board connector 20. When audio connector portion 22b of the flexible circuit is folded, the elasticity of the material from which the flexible circuit is made can cause the flexible circuit to impose normal forces against both housing 16 and board-to-board connector 20 as the flexible circuit attempts to expand out of the folded configuration. Accordingly, the folded configuration of audio connector portion 22b can impose a compressive force against board-to-board connector 20. The compressive force can reinforce both the mechanical and electrical board-to-board connection between flexible circuit 22 and circuit board 14.

To further reinforce the board-to-board connection between flexible circuit 22 and circuit board 14, shim 30 may be directly or indirectly disposed between housing 16 and board-to-board connector 20. Shim 30 can augment the compressive force imposed by the folded configuration of audio connector portion 22b on board-to-board connector 20. Thus, shim 30 also can act as a mechanical stop for board-to-board connector 20.

Shim 30 may include a compressible material, e.g., gel, foam, or sponge, or include a compressive device, e.g., a spring. The damping effect of the compressible material or device may protect the electronic device from compressive forces applied to the electronic device.

Figure 7A:
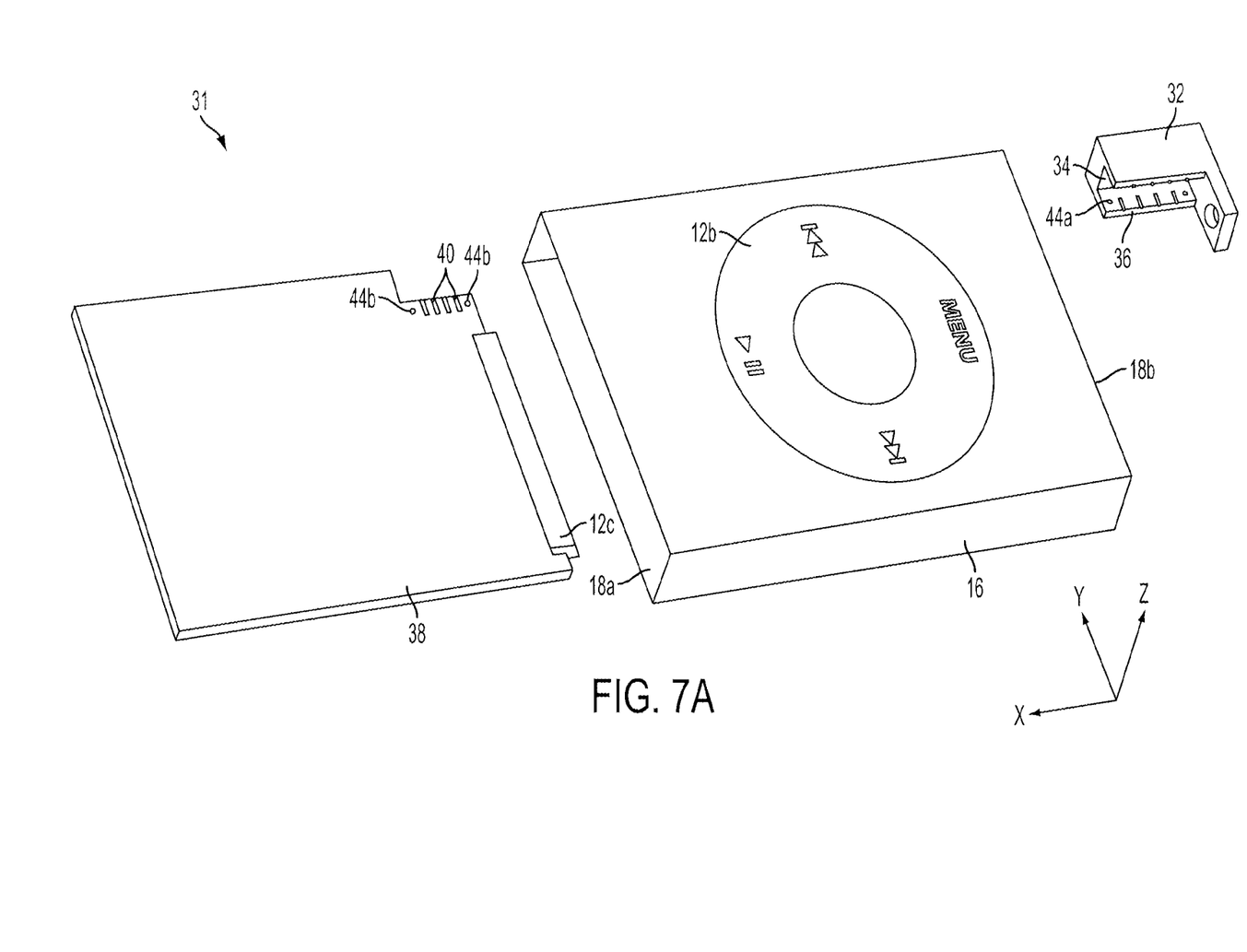
FIGS. 7A-C illustrate a second embodiment in accordance with the present invention.
Figure 7B:
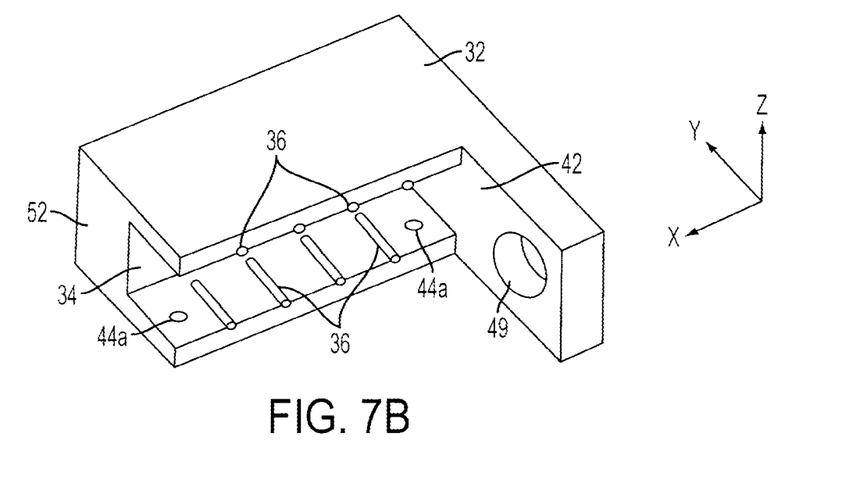
Figure 7C:
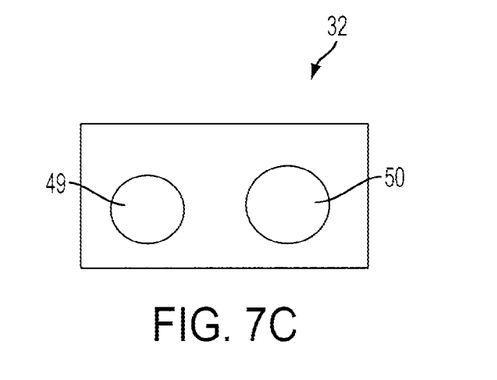

FIGS. 7A-C illustrate a second embodiment of the electronic device of the present invention. Electronic device 31 of FIGS. 7A-C can differ from the embodiment described with respect to FIGS. 2A-6B in that the device's audio connector couples directly to the circuit board. Audio connector 32 can include circuit board receptacle 34 disposed within body 52 of the audio connector. In one embodiment, circuit board receptacle 34 and audio jack receptacle 50 can have parallel longitudinal axes.

Electrical contacts 36 can be disposed within circuit board receptacle 34. Complementary electrical contacts 40 on circuit board 38 can be electrically coupled to electrical contacts 36 in circuit board receptacle 34 when the circuit board is disposed within the circuit board receptacle. Circuit board receptacle 34 can be dimensioned to permit audio jack 32 to slide onto circuit board 38 without damaging electrical contacts 36 or 40 and without compromising the electrical connection between contacts 36 and 40.

Circuit board receptacle 34 can constrain the position of audio connector 32 in the z-direction with respect to circuit board 38. While FIGS. 7A-C illustrate circuit board receptacle 34 as having a rectangular shape to accommodate the shape of the circuit board, circuit board receptacle 34 can have any shape that constrains audio connector 32 in the z-direction. The portion of circuit board 38 that can be coupled to receptacle 34 may have a complementary shape.

Figure 7D:
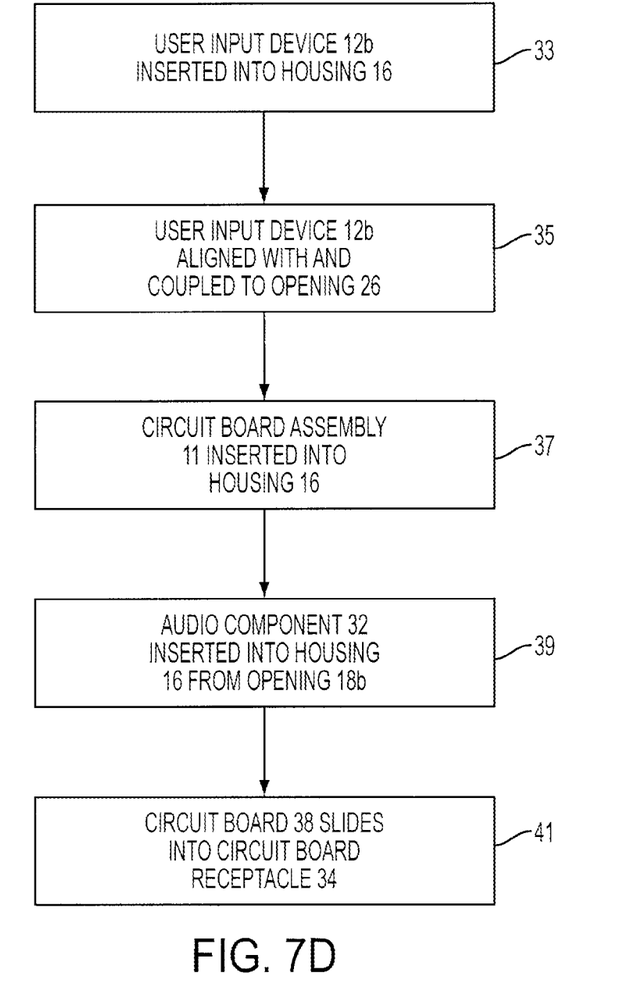
FIG. 7D provides an exemplary flowchart of steps for assembling the electronic device of FIGS. 7A-C in accordance with the present invention.

FIG. 7D provides a flowchart of steps for assembling electronic device 31 in accordance with one embodiment of the present invention. In step 33, user input component 12b can be inserted into housing 16. In step 35, user input component 12b can be coupled to the housing. Then, in step 37, circuit board assembly 11 can be inserted into housing 16 from opening 18a. Thereafter, in step 39, audio component 32 can be inserted into housing 16 from opening 18b. As the audio component is inserted into the housing, circuit board 38 can slide into circuit board receptacle 34 in step 41 until electrical contacts 36 disposed on the audio connector are directly coupled to electrical contacts 40 disposed on the circuit board.

While the audio connector of FIGS. 7A-C incorporates electrical contacts on two opposing surfaces of circuit board receptacle 34, contacts can be incorporated on one surface only or additional surfaces, e.g., surface 42 or the backplane of the circuit board receptacle. Complementary contacts on circuit board 38 can be removed or added accordingly.

To help position or align audio connector 32 with respect to circuit board 38 so that proper contact is made between the electrical contacts, audio connector 32 can incorporate one or more reference features 44a that can couple to complementary reference features 44b disposed in circuit board 38. For example, reference feature 44a may be circular divots and reference features 44b may be circular protuberances (or vice versa). When audio connector 32 is slid onto circuit board 38, the audio connector can be located accurately with respect to the circuit board by coupling reference features 44a to reference features 44b.

Reference features 44a and 44b can include divots and complementary protuberances of any shape, slots and complementary protuberances, or any other features that would help position or align the audio connector and the circuit board. Audio connector 32 also may be aligned with circuit board 38 by coupling the connector to other structures in the electronic device. For example, reference feature 49 may be coupled to a locating bracket coupled to multiple-pin connector 12c. See, e.g., U.S. Pat. No. 7,751,198 to Weber et al., which is incorporated by reference above.

Surface 42 of audio connector 32 also may be used to help position circuit board 38 with respect to the audio connector. For example, contact of circuit board 38 with surface 42 may indicate that audio connector 32 is properly positioned with respect to circuit board 38 along the x-axis. Thereafter, audio connector 32 can be moved along the y-axis until reference features 44a couple to reference features 44b.

Figure 8:
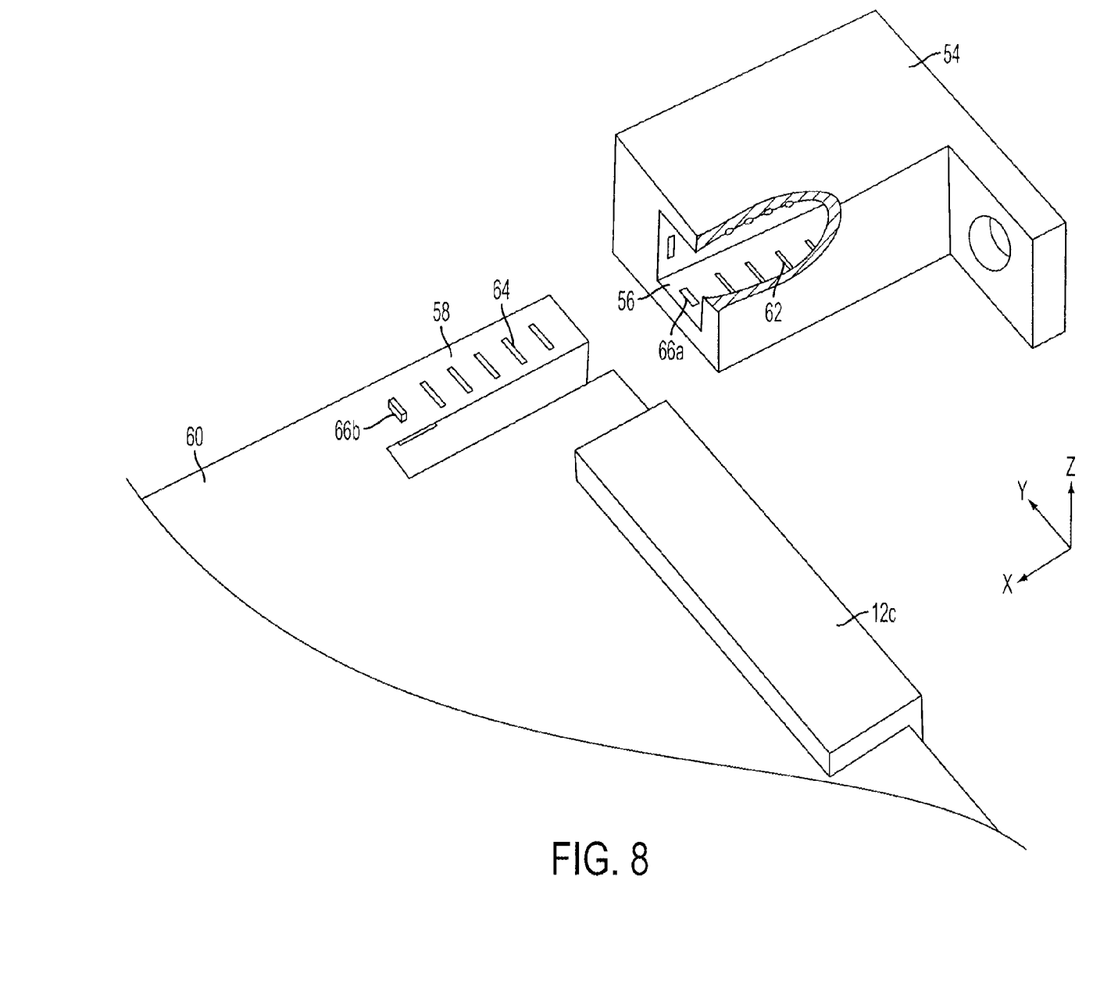
FIG. 8 illustrates a third embodiment in accordance with the present invention.

FIG. 8 illustrates a third embodiment of the present invention. Audio connector 54 can be similar to audio connector 32 of FIGS. 7A-C, except that the internal surfaces of circuit board receptacle 56 may enclose or surround neck 58 of circuit board 60 when neck 58 is disposed within the circuit board receptacle.

A portion of audio connector 54 has been cut out in FIG. 8 to show electrical contacts 62 disposed in circuit board receptacle 56. When neck 58 is inserted into receptacle 56, electrical contacts 64 disposed on neck 58 can be coupled directly to contacts 62.

Because circuit board receptacle 56 may enclose neck 58, the audio connector can be constrained to the circuit board in both the y and z directions, depending on the cross-sectional shapes of the circuit board receptacle and the neck of the circuit board. For example, if the cross-sectional shapes of the receptacle and neck are polygonal, the audio connector can be constrained to the circuit board in the y and z directions.

To help position the audio connector in the x-direction with respect to the circuit board, audio connector 54 can incorporate one or more reference features 66a and neck 58 can incorporate complementary reference features 66b. Like reference features 44a and 44b of FIGS. 7A-B, reference features 66a and 66b can be divots, slots, protuberances, or any other features that would help position or align the audio connector with respect to the circuit board.

Figure 9A:
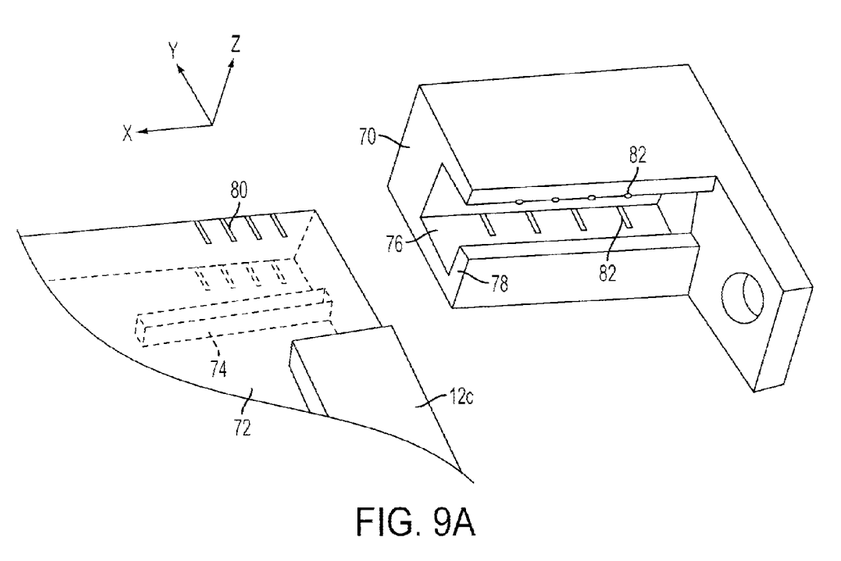
FIGS. 9A-B illustrate a fourth embodiment in accordance with the present invention.
Figure 9B:
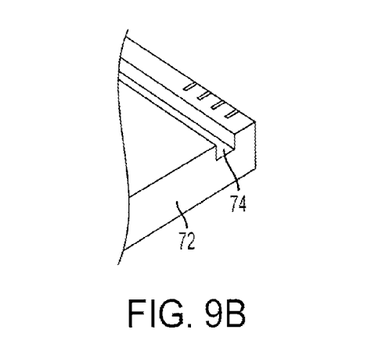

FIGS. 9A-B illustrate a fourth embodiment of the present invention. The fourth embodiment of the present invention may be similar to the embodiments illustrated in FIGS. 7A-C, except that circuit board 72 may include blind slot 74 and circuit board receptacle 76 may be configured differently. Blind slot 74 may be disposed in the top or bottom surface of circuit board 72. Audio connector 70 may incorporate at least one flange 78 having a cross-sectional shape that complements that of blind slot 74. When the circuit board is disposed within circuit board receptacle 76, the circuit board receptacle may surround portions of circuit board 72 by more than 180 degrees. As a result, blind slot 74 and flange 78 may constrain the audio connector to the circuit board in both the y and z directions, thereby serving as reference features.

When audio connector 70 is inserted into the housing, flange 78 can guide the audio connector along the track formed by blind slot 74. Electrical contacts 80 and 82 can be positioned within circuit board 72 and audio connector 70 (respectively) so that the electrical contacts are directly coupled when flange 78 reaches the end of blind slot 74.

Electronic devices that incorporate the audio components and circuit boards of FIGS. 8-9B can be assembled in a manner similar to that described with respect to FIG. 7D.

While the embodiments of FIGS. 7A-9B illustrate circuit board receptacles having cross-sectional shapes that are rectangular or square, the cross-sections of the receptacles may have any shape, e.g., circular or polygonal, as long as the receptacles can accommodate the circuit board.

Although particular embodiments of the present invention have been described above in detail, it will be understood that this description is merely for purposes of illustration. Alternative embodiments of those described hereinabove also are within the scope of the present invention. For example, the present invention can be applied to any electrical components that may need to be coupled to circuit boards after the circuit boards.

Furthermore, while the embodiment of FIGS. 2-7D may have two components coupled to flexible circuit 22, the teachings of the present invention may be applied to couple any number of components to the flexible circuit.

Combinations of the above-described embodiments of the present invention or portions thereof may be provided in one electronic device unit.

One of ordinary skill in the art will understand that, while the above-described embodiments of the present invention may facilitate certain manufacturing techniques and/or housing designs, those embodiments are not necessarily limited thereto. For example, while the described embodiments of the present invention may facilitate assembly of components into the electronic device housing from openings disposed on opposing ends of the housing, the embodiments also may be incorporated into an electronic device having housings in which the main body of the housing includes multiple parts. An example of such a multi-part housing includes a clamshell housing. The housing of an electronic device of the present invention also may include housings in which the main body includes only one piece. An example of such a housing includes, e.g., the housings of FIGS. 2A, 4, 5, and 7A. A housing of the present invention may provide only one opening through which components are inserted or multiple openings that can be disposed, for example, on multiple sides of the housing.

The above described embodiments of the present invention are presented for purposes of illustration and not of limitation. The present invention is limited only by the claims which follow.

What is claimed is:

1. A system comprising:
 a circuit board comprising:
  a first circuit board surface;
  a second circuit board surface;
  a third circuit board surface extending between the first circuit board surface and the second circuit board surface; and
  a slot disposed in the second circuit board surface and extending towards the first circuit board surface; and
 an electrical component comprising a circuit board receptacle, the circuit board receptacle comprising:
  a first receptacle surface;
  a second receptacle surface;
  a third receptacle surface extending between the first receptacle surface and the second receptacle surface; and
  a flange extending from the first receptacle surface and towards the second receptacle surface, wherein, when a portion of the circuit board is disposed within the circuit board receptacle, at least a portion of the flange is disposed within at least a portion of the slot.

2. The system of claim 1, wherein, when the portion of the circuit board is disposed within the circuit board receptacle:
 the first and second receptacle surfaces constrain the portion of the circuit board within the circuit board receptacle in at least a first direction; and
 the flange and slot constrain the portion of the circuit board within the circuit board receptacle in at least a second direction.

3. The system of claim 2, wherein:
 the portion of the circuit board is configured to be moved in a third direction with respect to the circuit board receptacle for disposing the portion of the circuit board within the circuit board receptacle; and
 the third direction is perpendicular to at least one of the first direction and the second direction.

4. The system of claim 3, wherein the third direction is perpendicular to both the first direction and the second direction.

5. The system of claim 2, wherein, when the portion of the circuit board is disposed within the circuit board receptacle:
 a first reference feature of the first circuit board surface is coupled to a first reference feature of the first receptacle surface; and
 the first reference feature of the first circuit board surface and the first reference feature of the first receptacle surface constrain the portion of the circuit board within the circuit board receptacle in at least a third direction.

6. The system of claim 5, wherein the third direction is perpendicular to at least one of the first direction and the second direction.

7. The system of claim 6, wherein the third direction is perpendicular to both the first direction and the second direction.

8. The system of claim 1, wherein the first receptacle surface, the second receptacle surface, the third receptacle surface, and the flange of the circuit board receptacle combine to surround a cross-section of the portion of the circuit board by more than 180 degrees when the portion of the circuit board is disposed within the circuit board receptacle.

9. The system of claim 8, wherein the first receptacle surface, the second receptacle surface, the third receptacle surface, and the flange of the circuit board receptacle combine to surround the cross-section of the portion of the circuit board by less than 360 degrees when the portion of the circuit board is disposed within the circuit board receptacle.

10. The system of claim 1, wherein the portion of the flange is configured to be moved along and within the slot for disposing the portion of the circuit board within the circuit board receptacle.

11. The system of claim 1, wherein:
 the system comprises an electronic device; and
 the electrical component comprises an input/output component of the electronic device.

12. The system of claim 11, wherein the input/output component comprises an audio jack receptacle.

13. The system of claim 1, wherein a first electrical contact of the first circuit board surface is electrically coupled to a first electrical contact of the first receptacle surface when the portion of the circuit board is disposed within the circuit board receptacle.

14. A system comprising:
 a circuit board comprising a first feature; and
 an electrical component comprising a circuit board receptacle comprising a second feature, wherein, when a portion of the circuit board is disposed within the circuit board receptacle:
  the circuit board receptacle constrains the portion of the circuit board in at least a first direction with respect to the circuit board;
  the first and second features constrain the portion of the circuit board in at least a second direction with respect to the circuit board; and
  the first direction is perpendicular to the second direction.

15. A system comprising:
 a circuit board comprising:
  a first circuit board surface;
  a second circuit board surface; and
  a third circuit board surface extending between the first circuit board surface and the second circuit board surface; and
 an electrical component comprising a circuit board receptacle, the circuit board receptacle comprising:
  a first receptacle surface;
  a second receptacle surface; and
  a third receptacle surface extending between the first receptacle surface and the second receptacle surface, wherein:
   a portion of the circuit board is configured to move with respect to the electrical component along a first axis for positioning the portion of the circuit board at a first position within the circuit board receptacle; and
   the portion of the circuit board is configured to move with respect to the electrical component along a second axis that is perpendicular to the first axis for re-positioning the portion of the circuit board from the first position to a second position within the circuit board receptacle.

16. The system of claim 15, wherein a first reference feature of the first circuit board surface is coupled to a first reference feature of the first receptacle surface when the portion of the circuit board is at the second position.

17. The system of claim 16, wherein the first reference feature of the first circuit board surface is not coupled to the first reference feature of the first receptacle surface when the portion of the circuit board is at the first position.

18. The system of claim 15, wherein a first electrical contact of the first circuit board surface is electrically coupled to a first electrical contact of the first receptacle surface when the portion of the circuit board is at the second position.

19. The system of claim 18, wherein the first electrical contact of the first circuit board surface is not electrically coupled to the first electrical contact of the first receptacle surface when the portion of the circuit board is at the first position.

20. The system of claim 15, wherein the third circuit board surface contacts the third receptacle surface when the portion of the circuit board is at the first position.

21. The system of claim 20, wherein the third circuit board surface contacts the third receptacle surface when the portion of the circuit board is at the second position.

22. The system of claim 15, wherein:
the circuit board receptacle further comprises a first opening between the first receptacle surface and the second receptacle surface;
the first opening opposes the third receptacle surface; and
a portion of the third circuit board surface is configured to move through the first opening and towards the third receptacle surface along the first axis for positioning the portion of the circuit board at the first position.

23. The system of claim 22, wherein:
the circuit board receptacle further comprises a second opening between the first receptacle surface and the second receptacle surface; and
the portion of the circuit board is configured to move through the second opening along the second axis for positioning the portion of the circuit board at the second position.

24. The system of claim 23, wherein the first opening is perpendicular to the second opening.

25. The system of claim 22, wherein:
the circuit board receptacle further comprises a fourth receptacle surface extending between the first receptacle surface and the second receptacle surface;
the circuit board receptacle further comprises a second opening between the first receptacle surface and the second receptacle surface;
the second opening opposes the fourth receptacle surface; and
the portion of the circuit board is configured to move through the second opening and towards the fourth receptacle surface along the second axis for positioning the portion of the circuit board at the second position.

26. The system of claim 15, wherein, when the portion of the circuit board is at the second position, the first and second receptacle surfaces constrain the portion of the circuit board within the circuit board receptacle in a first direction that is perpendicular to at least one of the first axis and the second axis.

27. The system of claim 15, wherein:
a first reference feature of the first circuit board surface is coupled to a first reference feature of the first receptacle surface when the portion of the circuit board is at the second position; and
when the portion of the circuit board is at the second position, the first reference feature of the first circuit board surface and the first reference feature of the first receptacle surface constrain the portion of the circuit board within the circuit board receptacle in a first direction that is parallel to one of the first axis and the second axis.

28. The system of claim 15, wherein:
the system comprises an electronic device; and
the electrical component comprises an input/output component of the electronic device.

29. The system of claim 28, wherein the input/output component comprises an audio jack receptacle.

30. A system comprising:
a circuit board including a portion having a plurality of electrical contacts; and
an electrical component, wherein the electrical component comprises a receptacle that mates with the portion having the plurality of electrical contacts, a first additional plurality of electrical contacts in the receptacle on a first inner surface of the receptacle, and a second additional plurality of electrical contacts in the receptacle on a second inner surface of the receptacle that opposes the first inner surface; and
a slot in the circuit board adjacent to the first and second additional plurality of electrical contacts, wherein the receptacle mates with the slot.

31. The system defined in claim 30, wherein the electrical component comprises an audio connector.

32. The system defined in claim 30, wherein the receptacle is defined by a first inner surface, a second inner surface, and a third inner surface that extends from the first inner surface to the second inner surface, and wherein the portion having the plurality of electrical contacts is constrained by the first, second, and third inner surfaces of the receptacle.

33. The system defined in claim 32, wherein the receptacle is further defined by a fourth inner surface that extends from the first inner surface to the second inner surface, wherein the first, second, third, and fourth inner surfaces completely enclose the portion having the plurality of electrical contacts.

34. The system defined in claim 33, wherein the portion having the plurality of electrical contacts comprises a protruding neck structure.

35. A system comprising:
a circuit board including a portion having a plurality of electrical contacts;
an electrical component, wherein the electrical component comprises a receptacle that mates with the portion having the plurality of electrical contacts; and
a multiple-pin connector coupled to the circuit board, wherein the portion having the plurality of electrical contacts is adjacent to the multiple-pin connector.

36. A system comprising:
a circuit board including a portion having a plurality of electrical contacts; and
an electrical component, wherein the electrical component comprises a receptacle that mates with the portion having the plurality of electrical contacts, wherein the circuit board comprises a slot having a first longitudinal axis, the receptacle mates with the slot, and each electrical contact of the plurality of electrical contacts has a second longitudinal axis that is substantially perpendicular to the first longitudinal axis.

* * * * *